United States Patent
Farkas et al.

(10) Patent No.: US 12,177,963 B2
(45) Date of Patent: Dec. 24, 2024

(54) MINIMIZING IMPEDANCE TOLERANCES DUE TO MISREGISTRATION

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 333 days.

(21) Appl. No.: 17/729,857

(22) Filed: Apr. 26, 2022

(65) Prior Publication Data
US 2023/0345617 A1 Oct. 26, 2023

(51) Int. Cl.
*H05K 1/02* (2006.01)
*H05K 1/11* (2006.01)

(52) U.S. Cl.
CPC ........... *H05K 1/0213* (2013.01); *H05K 1/115* (2013.01)

(58) Field of Classification Search
CPC ....... H05K 1/0245; H05K 2201/09236; H05K 1/0298; H05K 1/0253; H05K 2201/093; H05K 1/0219; H05K 1/117; H05K 2201/09709; H05K 1/115; H05K 1/0251; H05K 2201/09727; H05K 1/0218; H05K 1/025; H05K 3/429; H05K 2201/09318; H05K 2201/0949; H05K 2201/09681; H05K 2201/09718; H05K 3/4644; H01R 12/57; H01R 12/721; H01L 2924/3011; H01L 23/49838
See application file for complete search history.

(56) References Cited

U.S. PATENT DOCUMENTS

| | | | |
|---|---|---|---|
| 10,736,216 B1 | 8/2020 | Wang et al. | |
| 10,904,998 B2 | 1/2021 | Vasa et al. | |
| 2012/0193128 A1* | 8/2012 | Olsen | H05K 1/025 174/251 |
| 2019/0166687 A1* | 5/2019 | Chandra | H05K 1/181 |
| 2019/0297721 A1 | 9/2019 | Chandra et al. | |
| 2021/0321510 A1 | 10/2021 | Farkas et al. | |

* cited by examiner

*Primary Examiner* — Lincoln D Donovan
*Assistant Examiner* — Tyler J Pereny
(74) *Attorney, Agent, or Firm* — Larson Newman, LLP

(57) ABSTRACT

A printed circuit board of an information handling system includes a pair of signal vias including a pair of keepout objects. Each one of the keepout objects surrounds one of the signal vias. The printed circuit board includes a pair of signal traces that includes a positive signal trace and a negative signal trace, wherein the pair of signal traces are between the keepout objects, and wherein a width of each of the signal traces is increased.

20 Claims, 4 Drawing Sheets

MINIMIZING IMPEDANCE TOLERANCES DUE TO MISREGISTRATION

FIELD OF THE DISCLOSURE

This disclosure generally relates to information handling systems, and more particularly relates to minimizing impedance tolerances due to misregistration.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board of an information handling system includes a pair of signal vias including a pair of keepout objects. Each one of the keepout objects surrounds one of the signal vias. The printed circuit board includes a pair of signal traces that includes a positive signal trace and a negative signal trace, wherein the pair of signal traces are between the keepout objects, and wherein a width of each of the signal traces is increased.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

The components in an information handling system are conventionally connected together through signal lines, sometimes referred to as signal traces that travel along or through a printed circuit board (PCB). For example, an information handling system's motherboard may include thousands of signal lines providing power to and communications between components such as central processing units (CPUs), graphical processing units (GPUs), memory, communication cards, disk drives, and other peripherals. One challenge in PCB design is to maintain the desired characteristic or differential impedance along the entire trace of the signal from one component to another.

Ball grid arrays (BGAs) are increasingly important aspect of the PCB design. Getting traces out from underneath the board, also referred to as creating a breakout, is challenging as the BGA density and pin count continues to increase. In addition, as the pitch between different vias decreases, the space available to run the signal traces is getting smaller. To address this issue, differential traces are typically necked down or truncated to a smaller width to allow routing or avoid causing shorts. Even though care is usually taken to ensure that the necked down traces are referenced to the copper or ground planes, due to PCB manufacturing tolerances and misregistration, the traces may not have a full ground reference. These issues typically cause impedance and crosstalk issues at the BGA which may negatively affect signal quality. The problem is exaggerated when the traces are operating at high speeds, such as above 1 GHz. Unfortunately, the amount of misregistration, its probability and direction are not deterministic. To address these and other issues, the present disclosure adjusts the width along the length of the signal traces that is in the void area between two signal vias to minimize impedance tolerances due to misregistration.

Figure 1:
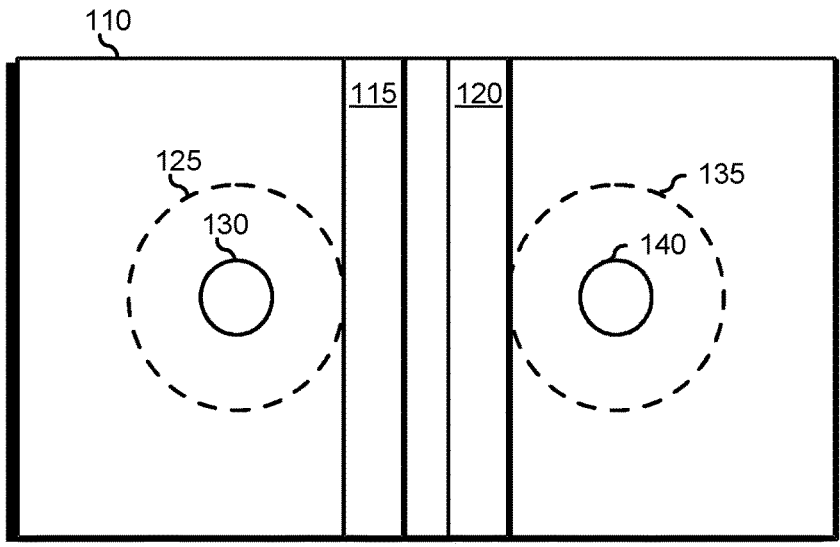
FIG. 1 is a block diagram illustrating a printed circuit board according to prior art.

FIG. 1 shows a top view of a portion of a PCB 100 with an original design layout of a pair signal traces in the prior art. PCB 100 includes ground plane 110, keepout objects 125 and 135, signal vias 130 and 140, and a pair of signal traces 115 and 120, wherein signal trace 115 is positive and signal trace 120 is negative. A keepout object may also be referred to herein as simply a keepout. A signal via may also be referred to herein as simply a via. Keepout object 125 may be a defined area around signal via 130 that a copper object may not intersect. Similarly, keepout object 135 is a defined area around signal via 140 that a copper object may not intersect. As designed, signal traces 115 and 120 are located between signal vias 130 and 140 and their surrounding keepout objects 125 and 135. One of skill in the art will recognize that there is space between the signal traces and that the signal traces typically do not route over void areas.

For illustration purposes, during the design of the layout of PCB 100, it may be determined that the differential impedance of traces 115 and 120 should be eighty five ohms. The differential impedance may be based on the addition of the positive and negative single-ended impedances, which are both fifty ohms, less trace-to-trace impedance of fifteen ohms. The positive single-ended impedance is impedance of positive trace to ground. The negative single-ended impedance is negative trace to ground. One of skill in the art will recognize that the differential impedance for a PCB is the instantaneous impedance of a pair of traces, also known as a differential pair. Maintaining the value of the differential impedance to its original design is important to avoid reflections.

Figure 2:
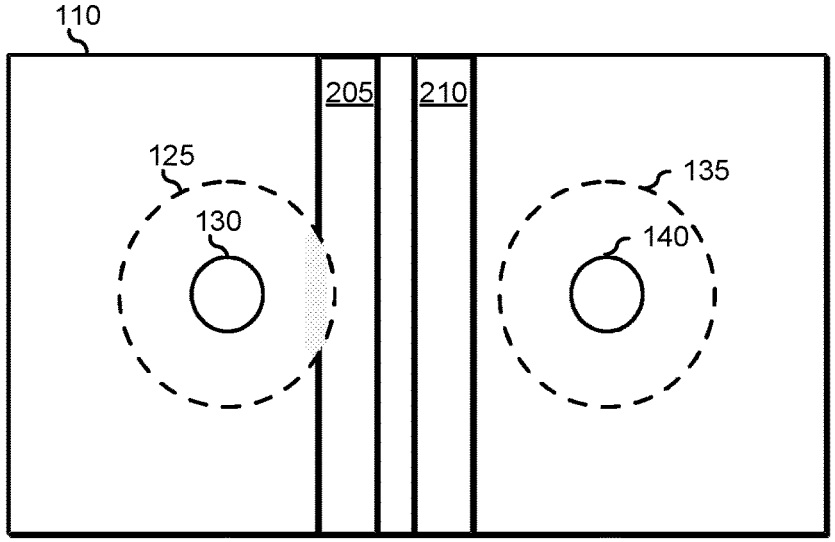
FIG. 2 is a block diagram illustrating a printed circuit board with a signal trace misregistration, according to prior art.

FIG. 2 shows a top view of a portion of a PCB 200 with a misregistration of the signal traces. PCB 200 includes ground plane 110, keepout objects 125 and 135, signal vias 130 and 140, and a pair of signal traces 205 and 210. Signal trace 205 is a positive and signal trace 210 is negative. Similar to signal traces 115 and 120 of FIG. 1, signal traces 205 and 210 are between signal vias 130 and 140. However, due to a misregistration of the signal traces that occurred during the fabrication of PCB 200, a portion of signal trace 205 is forced to route over a void area along a portion of keepout object 125 which may result in increased positive single-ended impedance. For illustration purposes, let us assume that the positive single-ended impedance increased to eighty ohms from fifty ohms of FIG. 1. This results in an increase of the differential impedance to one hundred and twenty five ohms which is above the originally designed eighty five ohms based on FIG. 1.

Figure 3:
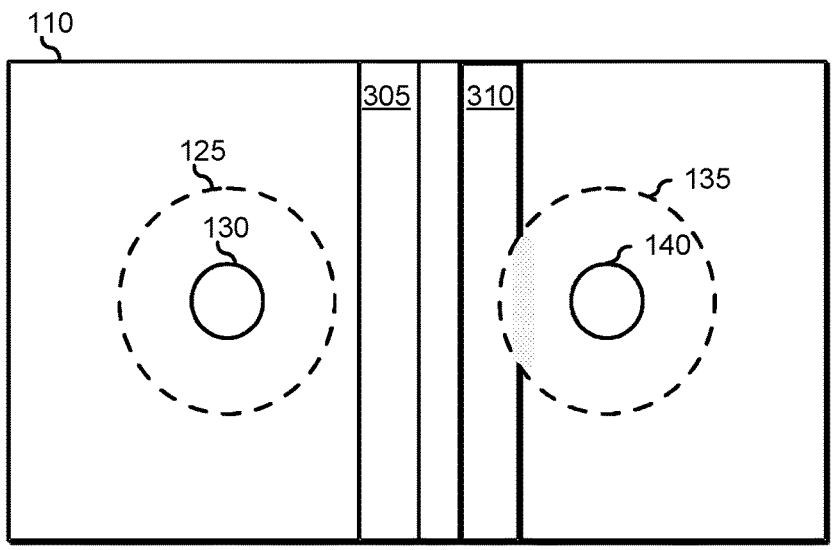
FIG. 3 is a block diagram illustrating a printed circuit board with a signal trace misregistration, according to prior art.

FIG. 3 shows a top view of a portion of a PCB 300 with a misregistration of the signal traces. PCB 300 includes ground plane 110, keepout objects 125 and 135, signal vias 130 and 140, and a pair of signal traces 305 and 310. Signal trace 305 is positive and signal trace 310 is negative. As designed, signal traces 115 and 120 are located in between signal vias 130 and 140. However, due to a misregistration during the fabrication of PCB 300 a portion of signal trace 310 is forced to route over a void along a portion of keepout object 135 which may result in increased negative single-ended impedance. For illustration purposes, let us assume that the negative single-ended impedance increased to ninety ohms from fifty ohms of FIG. 1. This results in an increase of the differential impedance to one hundred and twenty five ohms which is above the originally designed eighty five ohms of FIG. 1.

Figure 4:
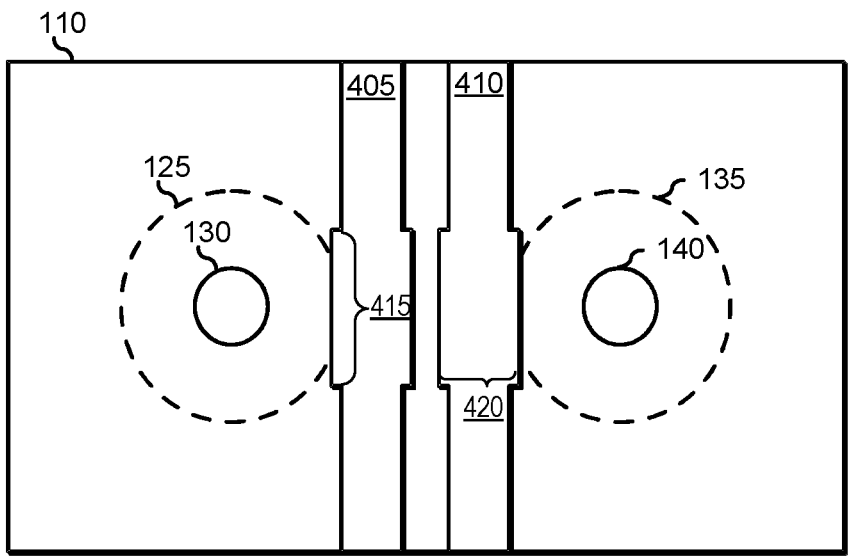
FIG. 4 is a block diagram illustrating a printed circuit board with signal traces designed for minimizing impedance tolerances due to misregistration, according to an embodiment of the current disclosure.

FIG. 4 shows a top view of a portion of a PCB 400 with a redesign of the layout of a pair of signal traces to minimize impedance tolerances due to misregistration. PCB 400 includes ground plane 110, keepout objects 125 and 135, signal vias 130 and 140, and a pair of signal traces 405 and 410. In an example, signal trace 405 is positive and signal trace 410 is negative. As designed, signal traces 405 and 405 are located between signal vias 130 and 140. In addition, the width of a portion of the signal traces adjacent to the keepout objects 125 and 135 are increased as compared to previous PCB traces, which may retain the differential impedance when a misregistration occurs.

The width along the length of each of signal traces 405 and 410 adjacent to keepout objects 125 and 135 may be increased. In certain examples, the width of a portion of signal traces 405 and 410 adjacent to the keepout objects 125 and 135 may be increased to any suitable amount which may retain the differential impedance as originally designed even when a misregistration occurs. The portion of each of signal traces 405 and 410 with an increased width may extend along the signal traces so that the length of the increased width may be as long as the diameter of keepout object 125 or keepout object 135, assuming both keepout objects are similar in diameter. Here, signal traces 405 and 410 have increased width 420 along length 415. The width of the signal traces 405 and 410 outside of the aforementioned length of the signal traces are not fattened, thus it is smaller than the width of the sides of the signal traces along the keepout objects.

Here, the width on each side of signal trace 405 and signal trace 410 is increased. For example, the internal facing and external facing sides along the length of the signal traces as described are fattened. The width may increase on each of the signal traces such that a signal trace does not touch the other signal trace and may not cover a void area. This increase of the width of the signal traces in this design allows the differential impedance of the signal traces to be maintained at the expense of signal-ended impedances when there is a misregistration during the fabrication of PCB 400.

For illustration purposes, during the redesign of the layout of the PCB 400, it is determined that the differential impedance should be eighty five ohms to maintain the original design in FIG. 1. Here, similar to PCB 100 the positive single-ended impedance is fifty ohms and the negative single-ended impedance is fifty ohms of signal traces 405 and 410 accordingly. The trace to trace impedance is also fifteen ohms. When a misregistration during fabrication of the PCB occurs, there may result in asymmetry with the single-ended impedance of the signal traces. This asymmetry is relied upon in this disclosure as it retains the differential impedance.

Figure 5:
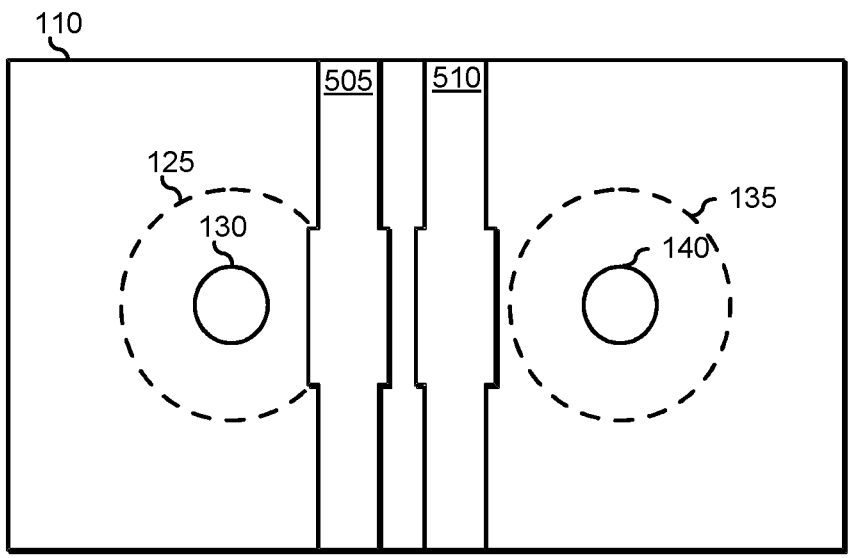
FIG. 5 is a block diagram illustrating a printed circuit board with signal traces designed for minimizing impedance tolerances due to misregistration, according to an embodiment of the current disclosure.

FIG. 5 shows a top view of a portion of a PCB 500 with a redesign of the layout of a pair of signal traces to minimize impedance tolerances due to misregistration. PCB 500 includes ground plane 110, keepout objects 125 and 135, signal vias 130 and 140, and a pair of signal traces 505 and 510, wherein signal trace 505 is positive and signal trace 510 is negative. As designed, signal traces 505 and 510 are located between signal vias 130 and 140. However, a misregistration of the signal traces has occurred during the fabrication of PCB 500, wherein a portion of signal trace 505 is forced to route over the void area associated with keepout object 125, which may result in higher positive single-ended impedance. In addition, because of the misregistration, signal trace 510 is routed over the ground which may result in lower negative single-ended impedance. For illustration purposes, let us assume that the positive single-ended impedance increased to eighty ohms and the negative single-ended impedance decreased to twenty ohms. These results in the differential impedance retaining its redesigned value of eighty ohms based on FIG. 4.

Figure 6:
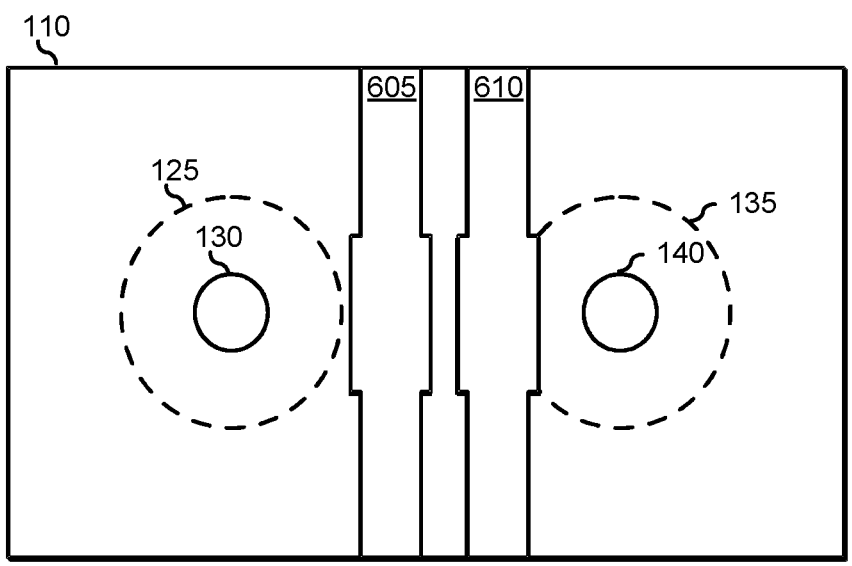
FIG. 6 is a block diagram illustrating a printed circuit board with signal traces designed for minimizing impedance tolerances due to misregistration, according to an embodiment of the current disclosure.

FIG. 6 shows a top view of a portion of a PCB 600 with a redesign of the layout of a pair of signal traces to minimize impedance tolerances due to misregistration. PCB 600 includes ground plane 110, keepout objects 125 and 135, signal vias 130 and 140, and a pair of signal traces 605 and 610, wherein signal trace 605 is positive and signal trace 610 is negative. As designed, signal traces 605 and 610 are located between of signal vias 130 and 140. However, due to a misregistration of the signal traces during the fabrication of PCB 600, a portion of signal trace 610 is forced to route over a portion of void area of keepout object 135, which may result in higher negative single-ended impedance. However, because of the misregistration, signal trace 605 is routed over the ground which may result in lower positive single-ended impedance. For illustration purposes, let us assume that the negative single-ended impedance increased to eighty ohms and the positive single-ended impedance decreased to twenty ohms. These results in the differential impedance retaining its redesigned value of eighty ohms based on FIG. 4.

Figure 7:
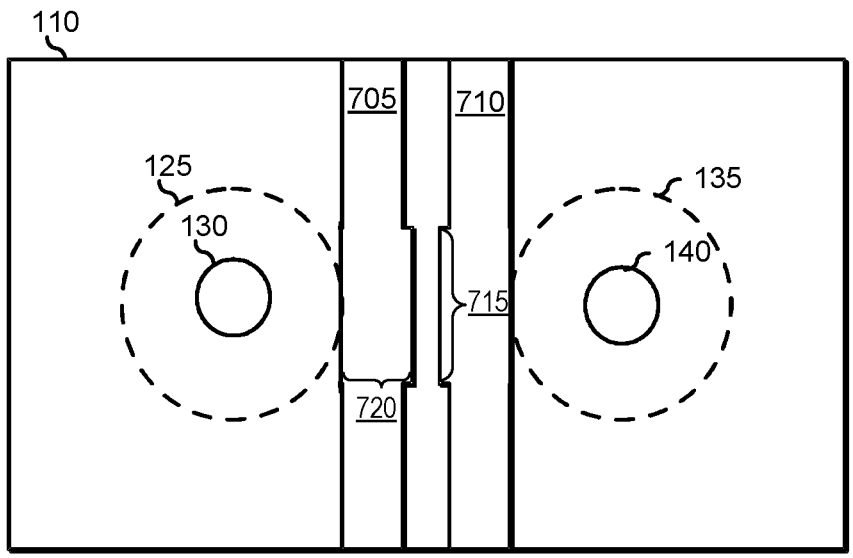
FIG. 7 is a block diagram illustrating a printed circuit board with signal traces designed for minimizing impedance tolerances due to misregistration, according to an embodiment of the current disclosure.

FIG. 7 shows a top view of a portion of a PCB 700 with a redesign of the layout of a pair of signal traces to minimize impedance tolerances due to misregistration. PCB 700 includes ground plane 110, keepout objects 125 and 135, signal vias 130 and 140, and a pair of signal traces 705 and 710, wherein signal trace 705 is positive and signal trace 710 is negative. As designed, signal traces 705 and 710 are located between signal vias 130 and 140. In addition, the width of a portion of the signal traces adjacent to the keepout objects 125 and 135 are increased which may retain the differential impedance as originally designed even when a misregistration occurs.

In this embodiment, the width of the signal traces are increased by fattening the internal facing sides of the signal traces as shown. In certain examples, the width of a portion of signal the width of a portion of signal traces 705 and 710 adjacent to the keepout objects 125 and 135 may be increased by any suitable amount which may retain the differential impedance as originally designed even when a misregistration occurs. The portion of each of signal traces 705 and 710 with an increased may extend along the signal traces so that the length of the increased width may be as long as the diameter of keepout object 125 or keepout object 135, assuming both keepout objects are similar in diameter. Here, signal traces 705 and 710 have increased width 720 along length 715. The width of the signal traces 705 and 710 outside of the aforementioned are not fattened, thus it is smaller than the width of the sides of the signal traces along the keepout objects.

Although the width of the internal facing sides of signal traces that are adjacent to the keepout objects are increased, the internal facing sides that are fattened does not touch and may not cover a void area. This increase of the width of the signal traces in this design allows the differential impedance of the signal traces to be maintained at the expense of signal-ended impedances when there is a misregistration during the fabrication of PCB 700.

Figure 8:
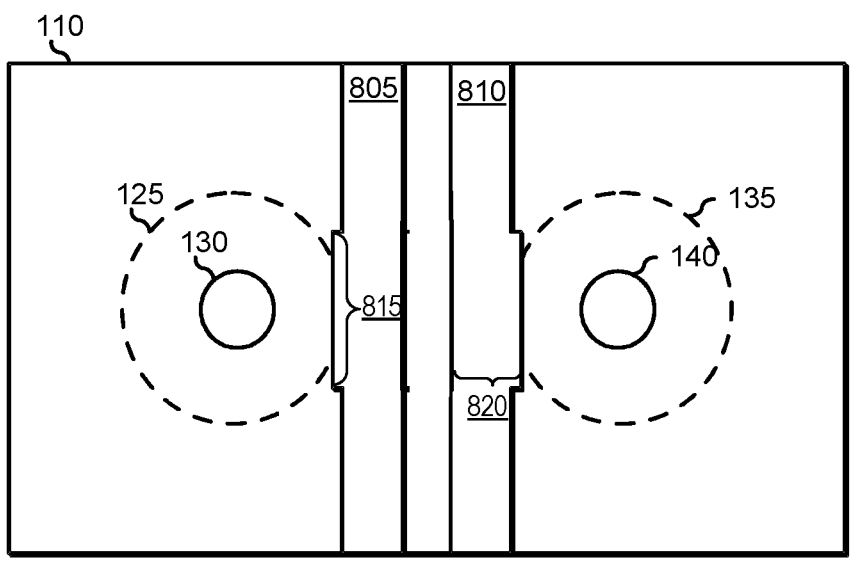
FIG. 8 is a block diagram illustrating a printed circuit board with signal traces designed for minimizing impedance tolerances due to misregistration, according to an embodiment of the current disclosure.

FIG. 8 shows a top view of a portion of a PCB 800 with a redesign of the layout of a pair of signal traces to minimize impedance tolerances due to misregistration. PCB 800 includes ground plane 110, keepout objects 125 and 135, signal vias 130 and 140, and a pair of signal traces 805 and 810, wherein signal trace 805 is positive and signal trace 810 is negative. As designed, signal traces 805 and 810 are located between signal vias 130 and 140. In addition, the width of a portion of the signal traces adjacent to the keepout objects 125 and 135 are increased which may put the differential impedance in check. In this embodiment, the width of the signal traces 805 and 810 which may retain the differential impedance as originally designed even when a misregistration occurs.

In this embodiment, the width of the signal traces 805 and 810 are increased by fattening the external side of the signal traces as shown. In certain examples, the width of a portion of signal the width of a portion of signal traces 805 and 810 adjacent to the keepout objects 125 and 135 may be increased by any suitable amount which may retain the differential impedance as originally designed even when a misregistration occurs. The portion of each of signal traces 805 and 810 with an increased may extend along the signal traces so that the length of the increased width may be as long as the diameter of keepout object 125 or keepout object 135, assuming both keepout objects are similar in diameter. Here, signal traces 805 and 810 have increased width 820 along length 815. The width of the signal traces 705 and 710 outside of the aforementioned are not fattened, thus it is smaller than the width of the sides of the signal traces along the keepout objects.

Although the width of the external sides of the signal traces adjacent to the keepout objects is increased, the internal facing sides do not touch. This increase of the width of the signal traces in this design allows the differential impedance of the signal traces to be maintained at the expense of signal-ended impedances when there is a misregistration during the fabrication of PCB 800. Although the illustrations above show a redesign of PCBs with signal vias, the present disclosure may be adapted to a PCB without signal vias adjacent to the signal traces or when the signal vias are back drilled.

Figure 9:
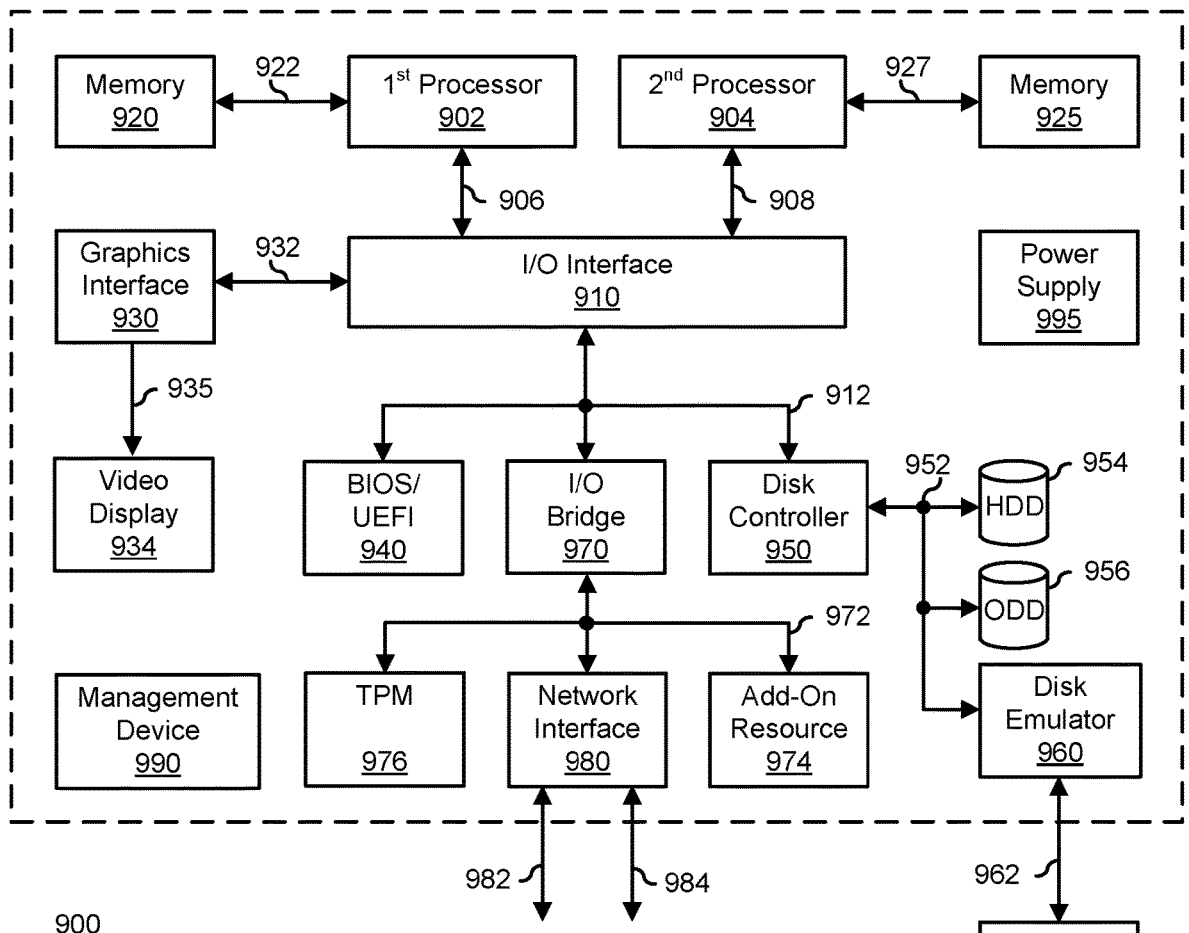
FIG. 9 is a block diagram illustrating a generalized information handling system according to another embodiment of the present disclosure.

FIG. 9 illustrates a generalized embodiment of an information handling system 900. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below, and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 964, an I/O bridge 970, one or more add-on resources 974, a trusted platform module (TPM) 976, a network interface 980, a management device 990, and a power supply 995. Processors 902 and 904, I/O interface 910, memories 920 and 925, graphics interface 930, BIOS/UEFI module 940, disk controller 950, HDD 954, ODD 956, disk emulator 960, SSD 964, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932, and provides a video display output 935 to a video display 934. In a particular embodiment, information handling system 900 includes separate memories that are dedicated to each of processors 902 and 904 via separate memory interfaces. An example of memories 920 and 925 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 356, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 1394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912, or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 3974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 380 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900. Management device 990 can operate off of a separate power plane from the components of the host environment so that the management device receives power to manage information handling system 900 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:
   a pair of signal vias including a pair of keepout objects, wherein each of the keepout objects surrounds one of the signal vias; and
   a pair of signal traces that includes a positive signal trace and a negative signal trace, wherein the pair of signal traces are between the keepout objects, wherein a width of each of the signal traces is increased, and wherein the positive signal trace exhibits increased positive single-ended impedance when routed over a void area due to a misregistration.

2. The printed circuit board of claim 1, wherein an internal facing side of the signal traces is fattened.

3. The printed circuit board of claim 1, the negative signal trace exhibits decreased negative single-ended impedance when routed over a ground area due to the misregistration.

4. The printed circuit board of claim 1, wherein a differential impedance of the pair of signal traces is maintained based on increased positive single-ended impedance and decreased negative single-ended impedance due to the misregistration.

5. The printed circuit board of claim 1, wherein a differential impedance of the pair of signal traces is maintained based on decreased positive single-ended impedance and increased negative single-ended impedance due to the misregistration.

6. The printed circuit board of claim 1, wherein the width of the signal traces is increased to maintain a differential impedance of the pair of signal traces due to the misregistration.

7. A printed circuit board, comprising:
   a pair of signal vias adjacent to each other; and
   a pair of signal traces each having a first width and a second width, wherein the first width is less than the second width, and wherein the second width is on a portion of each of the signal traces between the pair of signal vias, wherein the first width of the signal traces is increased to maintain a differential impedance of the pair of signal traces due to a misregistration.

8. The printed circuit board of claim 7, wherein an internal facing side of the signal traces is fattened.

9. The printed circuit board of claim 7, wherein a keepout object is around each of the pair of signal vias.

10. The printed circuit board of claim 7, wherein the second width is based on fattening of both sides of each of the signal traces.

11. The printed circuit board of claim 7, wherein the second width is based on fattening of each internal facing side of the signal traces.

12. The printed circuit board of claim 7, wherein the second width is based on fattening of each external facing side of the signal traces.

13. The printed circuit board of claim 7, wherein the differential impedance of the pair of signal traces is maintained based on increased positive single-ended impedance and decreased negative single-ended impedance due to the misregistration.

14. A printed circuit board comprising:
    a pair of signal vias including a pair of keepout objects, wherein each of the keepout objects surrounds one of the signal vias; and
    a pair of signal traces that includes a positive signal trace and a negative signal trace, wherein the pair of signal traces are between the keepout objects, and wherein a width of each of the signal traces is increased to be equal to a diameter of the keepout objects.

15. The printed circuit board of claim 14, wherein the width of each of the signal traces is increased to maintain a differential impedance of the pair of signal traces due to a misregistration.

16. The printed circuit board of claim 14, wherein the width of each of the signal traces is increased based on fattening of both sides of each of the signal traces along a length equal to the diameter of the keepout objects.

17. The printed circuit board of claim 14, wherein the width is increased based on fattening of internal facing sides of each of the signal traces along a length equal to the diameter of the keepout objects.

18. The printed circuit board of claim 14, wherein the width is increased based on fattening of external sides of each of the signal traces along a length equal to the diameter of the keepout objects.

19. The printed circuit board of claim 14, wherein differential impedance of the pair of signal traces is maintained based on increased positive single-ended impedance and decreased negative single-ended impedance due to a misregistration.

20. The printed circuit board of claim 14, wherein differential impedance of the pair of signal traces is maintained based on decreased positive single-ended impedance and increased negative single-ended impedance due to a misregistration.

* * * * *